United States Patent [19]
Cheng

[11] Patent Number: 5,994,216
[45] Date of Patent: Nov. 30, 1999

[54] METHOD OF FORMING A REDUCED SIZE CONTACT IN A DIELECTRIC LAYER BY USING BIRD'S BEAK OF OXIDIZED POLYSILICON TO CREATE AN ETCHING MASK

[75] Inventor: Chih-Hsiung Cheng, Hsinchu, Taiwan

[73] Assignee: Vanguard International Semiconductor Corporation, Taiwan

[21] Appl. No.: 09/065,658

[22] Filed: Apr. 23, 1998

[51] Int. Cl.⁶ ................................................. H01L 21/31
[52] U.S. Cl. ..................... 438/635; 438/637; 438/763; 438/911; 438/947
[58] Field of Search ................... 438/431, 439, 438/443, 444, 637, 635, 700, 761, 764, 770, 773, 775, 911, 947, 763

[56] References Cited

U.S. PATENT DOCUMENTS 5,795,814  8/1998  Tasaka ..................................... 438/424

*Primary Examiner*—Wael M. Fahmy
*Assistant Examiner*—Kurt Eaton
*Attorney, Agent, or Firm*—Christensen O'Connor Johnson & Kindness PLLC

[57] ABSTRACT

A method for forming a reduced size contact hole over a structure. The method comprises the steps of: forming a dielectric layer on said structure; forming a polysilicon layer on said dielectric layer; forming a silicon nitride layer on said polysilicon layer; forming a photoresist block on said silicon nitride layer to cover a portion of said silicon nitride layer defining a contact hole region; removing portions of said silicon nitride layer left uncovered by said photoresist block; removing said photoresist block; forming field oxide isolation regions using said silicon nitride layer as a mask, said field oxide isolation regions having bird's beaks penetrating under said silicon nitride layer; removing said silicon nitride layer, thereby exposing a portion of said polysilicon layer left exposed by said field oxide isolation regions; etching said polysilicon layer using said field oxide isolation regions as a first mask; and etching said dielectric layer using said polysilicon layer as a second etching mask.

13 Claims, 3 Drawing Sheets

METHOD OF FORMING A REDUCED SIZE CONTACT IN A DIELECTRIC LAYER BY USING BIRD'S BEAK OF OXIDIZED POLYSILICON TO CREATE AN ETCHING MASK

FIELD OF THE INVENTION

The present invention relates to a method of fabricating a contact region for semiconductor devices, and more specifically, to a method for scaling down the size of the contact by advantageously using bird's beak effect.

BACKGROUND OF THE INVENTION

Microelectronic devices are typically formed from a semiconductor material, for example silicon, germanium, etc . . . . It has been a trend to increase the packaging density of wafers. The large integration of semiconductor ICs has been accomplished by a reduction in individual device size. With this reduction of device size, many challenges arise in the manufacture of the ICs. As semiconductor devices become more dense, it is also necessary to decrease the size of circuit components.

Modern integrated circuits interconnect literally millions of devices to perform a certain function. The performance of the integrated circuits is related to the performance and reliability of its constituent individual devices. In order to drive or control these devices to perform their function, periphery circuits are needed for the integrated circuits. Each device requires interconnections for exchanging electrical signals from one device to another device. Specifically, multi-level interconnection techniques are widely used for high density integrated circuits.

One prior art method for fabricating the interconnection is shown in FIG. 1, which shows a semiconductor substrate 2. Interconnections 4 are patterned over the substrate 2. A dielectric layer 6 such as an oxide is deposited over the semiconductor substrate 2 for isolation purposes. Then, a contact hole 8 is formed in the dielectric layer 6. The contact hole 8 is typically formed by using photolithography technologies. For high density integrated circuits, the dimension of the contact hole 8 must be made smaller. Indeed, the smaller the contact hole 8 the better. However, the width of the contact hole 8 is limited by the resolution of the photolithography techniques. Assume that the lowest width dimension of the contact hole 8 formed by current lithography technologies is represented by "W1" in FIG. 1. The space between the edge of the contact hole 8 and the underlying interconnections 4 is denoted by "S1".

The aforementioned structure is well known and widely used in the fabrication of ULSI (ultra large scale integrated) circuits. However, the general processes become more challenging as the spacing between the metal interconnections 4 further shrink. Further, reducing the size of conventional contact hole 8 is limited, due to the limits of photolithography. The spacer "S1" becomes smaller and smaller as the space between interconnections 4 becomes smaller. Therefore, the spacer dimension "S1" becomes so small that it is no longer reliable for insulation purposes. Thus, what is required is a method for making the contact hole 8 with reduced width dimension that is beyond the limitation of current photolithography techniques.

Isolation techniques, such as the local oxide of silicon (LOCOS), have been developed to isolate devices in integrated circuits. In the LOCOS approach, a silicon oxide/silicon nitride composition layer covers active regions of the wafer. The silicon oxide/silicon nitride composition structure serves as a mask for subsequent processing. Then, field oxide (FOX) isolations are formed on the unmasked regions by thermal oxidation in oxygen. However, at the edges of the silicon nitride, some oxidant laterally diffuses. Oxide forms under the nitride edges and lifts the nitride edges. This lateral extension of the field oxide into the active region of the wafer is known as the "bird's beak effect."

Many techniques have been developed in an attempt to reduce the undesirable encroachment of bird's beak. However, in the present invention, the extended bird's beak penetration effect can be used to reduce the size of the contact hole.

SUMMARY OF THE INVENTION

A method for forming a reduced size contact hole over a structure is disclosed. The method comprises the steps of: forming a dielectric layer on said structure; forming a polysilicon layer on said dielectric layer; forming a silicon nitride layer on said polysilicon layer; forming a photoresist block on said silicon nitride layer to cover a portion of said silicon nitride layer defining a contact hole region; removing portions of said silicon nitride layer left uncovered by said photoresist block; removing said photoresist block; forming field oxide isolation regions using said silicon nitride layer as a mask, said field oxide isolation regions having bird's beaks penetrating under said silicon nitride layer; removing said silicon nitride layer, thereby exposing a portion of said polysilicon layer left exposed by said field oxide isolation regions; etching said polysilicon layer using said field oxide isolation regions as a first mask; and etching said dielectric layer using said polysilicon layer as a second etching mask.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein.

DETAILED DESCRIPTION OF THE PREFERRED EMBODIMENT

Figure 2:
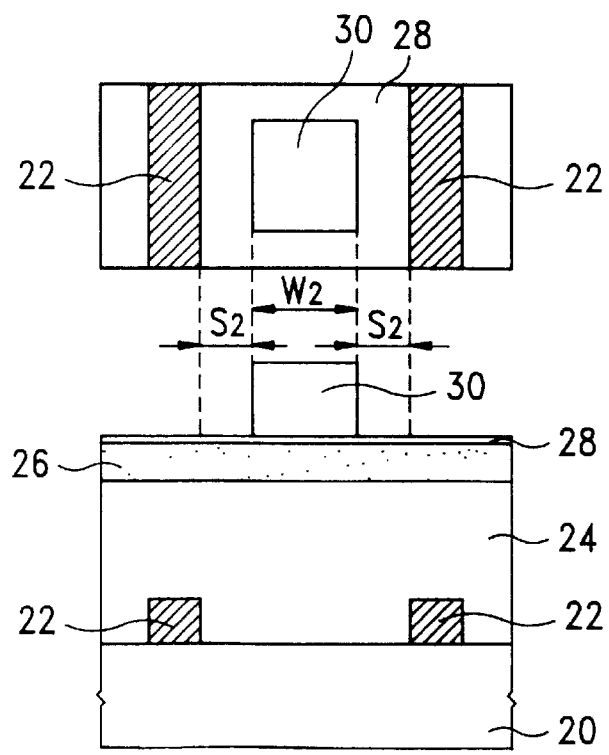
FIGS. 2–6 are cross-sectional views of a semiconductor wafer illustrating the method of forming a reduced size contact hole in accordance with the present invention.

Referring to FIG. 2, a semiconductor structure formed according to the present invention suitably includes a single crystal wafer 20 with a<100>crystallographic orientation. In a preferred embodiment, interconnections 22 are formed over the substrate 20 and separated by a predetermined distance. The interconnections 22 are typically formed of electrical conductive material, such as metal, alloy or polysilicon. Next, a dielectric layer 24 is formed over the substrate 20 and the interconnections 22 for isolation purposes. The dielectric layer can be formed of silicon oxide or silicon nitride.

For example, silicon oxide is suitably formed using a chemical vapor deposition (CVD) process, with a tetraethyl orthosilicate (TEOS) source, at a temperature between about 600 to 800 degrees centigrade and pressure between about 0.1 to 10 torr. Alternatively, the silicon oxide can also be formed using thermal oxidation. The silicon nitride can be formed in a furnace at about 400 to 450 degrees centigrade. The reaction gases of the process are $SiH_4$, $N_2O$ and $NH_3$.

Figure 1:
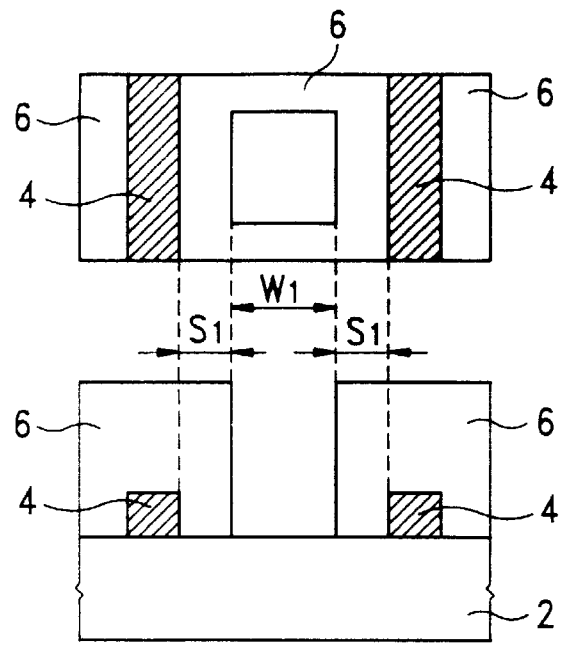
FIG. 1 is a cross-sectional view of a semiconductor wafer illustrating a contact hole between interconnections in accordance with prior art.

Subsequently, a polysilicon or silicon layer 26 is formed on the dielectric layer 24 to a thickness of about 200 to 2000 angstroms. Still referring to FIG. 1, after the layer 26 is formed, a silicon nitride layer 28 is formed on the silicon layer 26. Then, a photoresist block 30 is patterned on the silicon nitride layer 28 to cover a portion of the layer 28 that will eventually be removed to form a contact hole.

Assume that the width of the photoresist block 30 is formed with the highest possible resolution of photolithography. Thus, the dimension "W2" of the photoresist 30 is the same as "W1" in FIG. 1. Further assume that the space between the interconnections 22 and the edge of the photoresist block 30 is reduced to "S2" due to the decreased distance between the interconnections 22. Therefore, "S1" is wider than "S2".

Figure 3:
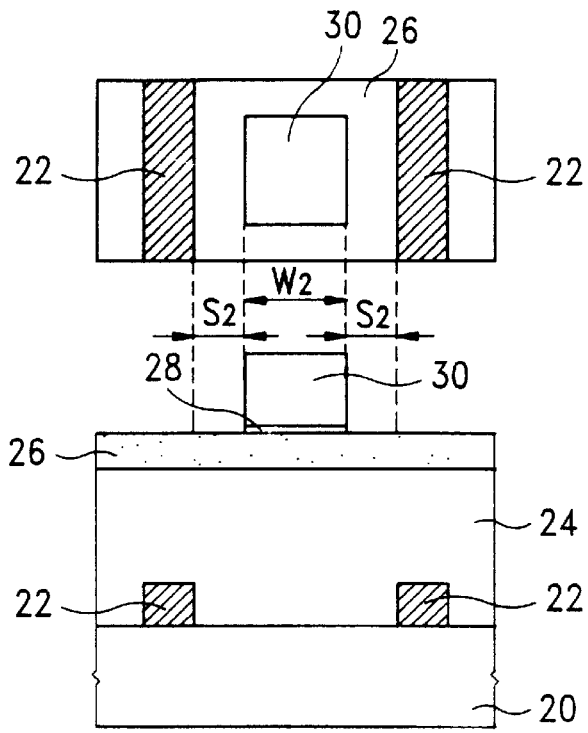

Turning to FIG. 3, the silicon nitride layer 28 left uncovered by the photoresist block 30 is etched using the photoresist block 30 as an etching mask. The portion of the silicon nitride layer 28 that lies under the photoresist block 30 remains on the polysilicon or silicon layer 26. The areas that are covered by the silicon nitride layer 28 remaining will be the areas for forming a contact hole in later processing. The photoresist block 30 is then removed.

Figure 4:
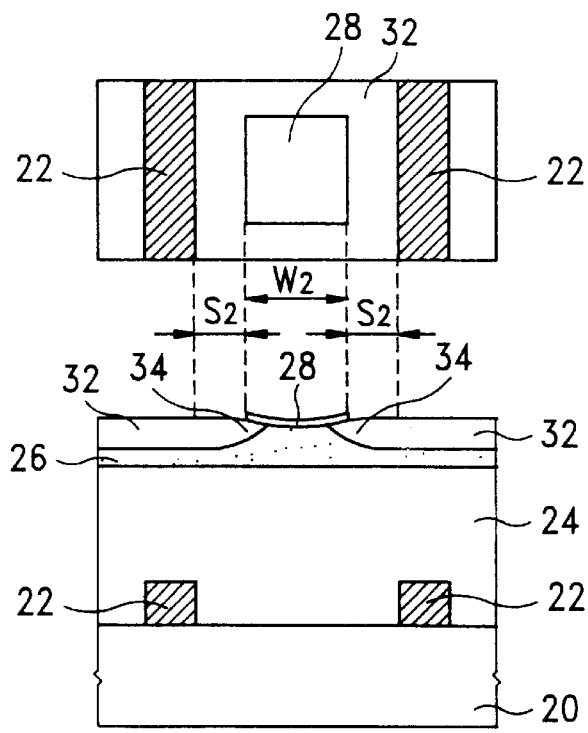

Now referring to FIG. 4, the remaining silicon nitride layer 28 serves as a mask for a thermal processing. In particular, field oxide (FOX) isolations 32 are formed on the unmasked regions by thermal oxidation in oxygen. At the edges of the silicon nitride layer 28, some oxidant laterally diffuses in accordance with the bird's beak effect. Oxide forms under the nitride edges and lifts the nitride edges. This is known as bird's beaks 34 of the FOX isolations 32. The extended bird's beak penetration effect can be used for reducing the size of the contact hole, thereby forming a contact hole that is beyond the normal limits of the photolithography technique used to form the photoresist block 30.

Figure 5:
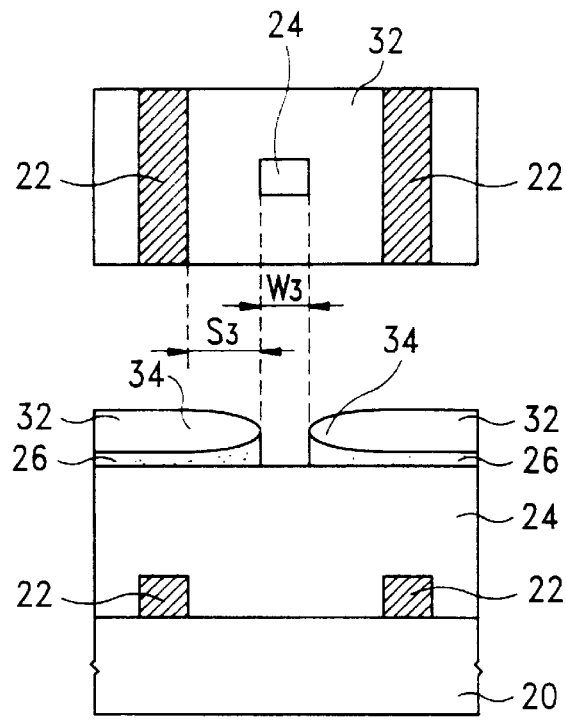

As shown in FIG. 5, the silicon nitride layer 28 is subsequently removed after the FOX regions 32 are formed. An anisotropic etching is then carried out to etch the polysilicon or silicon layer 26 to the surface the dielectric layer 24, thereby forming an opening 34 having a width "W3" in the polysilicon or silicon layer 26. The FOX regions 32 serves as an etching mask for the step. It should be noted that the width "W3" is narrower than the dimension "W2". Thus, the scale of the isolation regions 32 can be controlled by the oxidation and the contact hole region can be defined beyond the limitation of the photolithography used to form the photoresist block 30. Further, the space S3 is now larger than S2.

Figure 6:
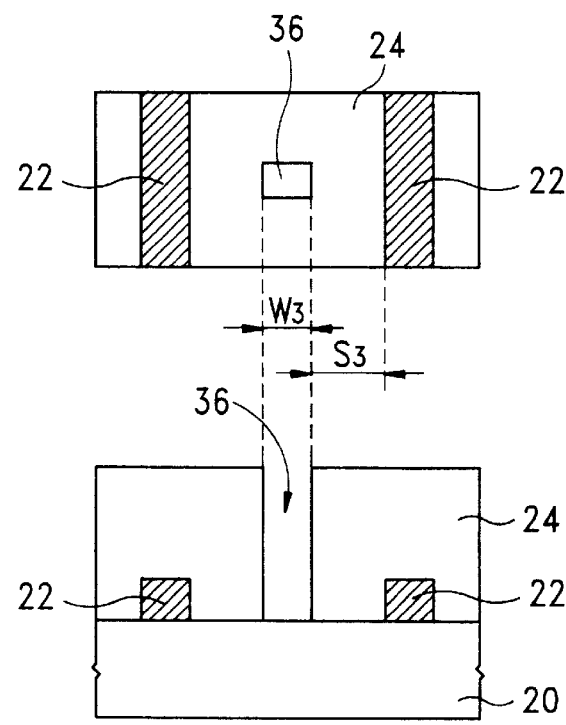

Turning to FIG. 6, a further etching is performed to etch the oxide material (the dielectric layer 24) and the FOX regions 32. If the dielectric layer 24 is formed of oxide, the etching can be used directly. If the dielectric layer is formed of nitride, then the FOX regions 32 have to be removed first. The FOX regions 32 are thinner than the dielectric layer 24. In either case, the FOX regions 32 are completely removed during the etching step, the polysilicon or silicon layer 26 is used as a mask to etch the dielectric layer 24, thereby forming a contact hole 36 in the dielectric layer 24. Preferably, there is etching selectivity between the polysilicon or silicon layer 26 and the oxide layer or nitride layer 24. Preferably, it is desirable to select a suitable etching selectivity between the two layers 24, 26 such that the polysilicon or silicon layer 26 will be removed in the step. Thus, there is no remaining silicon layer 26 on the dielectric layer 24. Thus, the contact hole 36 is formed having a width that is beyond the limitation of the photolithography used to form the photoresist block 30. Further, a safety spacing dimension (S3) between the contact and the interconnections is achieved by narrowing the width of the contact hole 36.

As will be understood by a person skilled in the art, the foregoing embodiments illustrate rather than limit the present invention. It is intended that various modifications and similar arrangements are included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

What is claimed is:

1. A method for forming a reduced size contact hole between two interconnections on a semiconductor substrate, the method comprising the steps of:

forming a dielectric layer on said interconnections;

forming a polysilicon layer on said dielectric layer;

forming a silicon nitride layer on said polysilicon layer;

forming a photoresist block on said silicon nitride layer to cover a portion of said silicon nitride layer defining a contact hole region that is between said two interconnections;

removing portions of said silicon nitride layer left uncovered by said photoresist block;

removing said photoresist block;

forming field oxide isolation regions using said silicon nitride layer as a mask, said field oxide isolation regions having bird's beaks penetrating under said silicon nitride layer and said field oxide isolation regions overlying portions of said polysilicon layer left unoxidized;

removing said silicon nitride layer, thereby exposing a portion of said polysilicon layer left uncovered by said field oxide isolation regions;

etching said exposed portion of said polysilicon layer left uncovered using said field oxide isolation regions as a first etching mask; and etching said dielectric layer using said portions of said polysilicon layer left unoxidized as a second etching mask to form said reduced size contact hole.

2. The method of claim 1, wherein said dielectric layer comprises a silicon oxide layer.

3. The method of claim 1, wherein said dielectric layer comprises a silicon nitride layer.

4. The method of claim 2, wherein said field oxide isolation regions are removed during the etching step used to form said contact hole.

5. The method of claim 1, further including the step of removing said field oxide isolation regions before etching said first dielectric layer.

6. The method of claim 1, wherein said portions of said polysilicon layer left unoxidized are removed during said etching to form said contact hole by selecting an appropriate etching selectivity between said polysilicon layer and said dielectric layer.

7. The method of claim 1, wherein said field oxide isolation regions are formed by a thermal process.

8. A method for forming a reduced size contact hole over a structure, the method comprising the steps of:

forming a dielectric layer on said structure;

forming a polysilicon layer on said dielectric layer;

forming a silicon nitride layer on said polysilicon layer;

forming a photoresist block on said silicon nitride layer to cover a portion of said silicon nitride layer defining a contact hole region;

removing portions of said silicon nitride layer left uncovered by said photoresist block;

removing said photoresist block;

forming field oxide isolation regions using said silicon nitride layer and said field oxide isolation regions overlying portions of said polysilicon layer left unoxidized as a mask, said field oxide isolation regions having bird's beaks penetrating under said silicon nitride layer;

removing said silicon nitride layer, thereby exposing a portion of said polysilicon layer left exposed by said field oxide isolation regions;

etching said exposed portion of said polysilicon layer left uncovered using said field oxide isolation regions as a first mask; and etching said dielectric layer using said portions of said polysilicon layer left unoxidized as a second etching mask to form said reduced size contact hole.

9. The method of claim 8, wherein said dielectric layer comprises a silicon oxide layer.

10. The method of claim 8, wherein said dielectric layer comprises a silicon nitride layer.

11. The method of claim 9, wherein said field oxide isolation regions are removed during the etching to form said contact hole.

12. The method of claim 8, further including the step of removing said field oxide isolation regions before etching said first dielectric layer.

13. The method of claim 8, wherein said field oxide isolation regions are formed by a thermal process.

* * * * *